United States Patent [19]

Nakamura et al.

[11] Patent Number: 4,651,042

[45] Date of Patent: Mar. 17, 1987

[54] PIEZOELECTRIC VIBRATOR AND MANUFACTURING METHOD THEREOF

[75] Inventors: Takeshi Nakamura, Uji; Kenji Ando, Kawasaki; Ikuo Matsumoto, Nagaokakyo, all of Japan

[73] Assignee: Murata Manufacturing Co., Ltd., Japan

[21] Appl. No.: 707,758

[22] Filed: Mar. 4, 1985

[30] Foreign Application Priority Data

Mar. 12, 1984 [JP] Japan .................................. 59-47950

[51] Int. Cl.[4] ........................................... H01L 41/08
[52] U.S. Cl. .................................... 310/321; 310/348; 310/351; 29/25.35
[58] Field of Search ................ 310/321, 324, 370, 344, 310/348, 351; 29/25.35

[56] References Cited

U.S. PATENT DOCUMENTS 4,293,986 10/1981 Kobayashi et al. ............. 310/370 X
4,583,017 4/1986 Nakamura et al. ............. 310/348 X
4,609,844 9/1986 Nakamura et al. ............. 310/348 X Primary Examiner—Patrick R. Salce
Assistant Examiner—Emanuel Todd
Attorney, Agent, or Firm—Ostrolenk, Faber, Gerb & Soffen

[57] ABSTRACT

A piezoelectric vibrator comprises a substrate consisting of Elinvar, in which a vibrating element is formed as an island. The vibrating element is connected to and supported by strip-like connecting portions which are connected with the surrounding frame. A piezoelectric film is formed on the surface of the vibrating element. Of the longitudinal end portions of the vibrating element in the vicinity of the connecting portions, one main surface side is formed as a thin-plate portion by etching, while the rest of the vibrating element has its thickness intact. The longitudinal edges of vibrating element are defined by etching carried out simultaneously with or after the previous etching step.

8 Claims, 7 Drawing Figures (A)

(B)

(C)

(D)

(E)

PIEZOELECTRIC VIBRATOR AND MANUFACTURING METHOD THEREOF

BACKGROUND OF THE INVENTION

1. Field of the Invention

The present invention relates to a piezoelectric vibrator and a manufacturing method thereof. More particularly, the present invention relates to a piezoelectric vibrator which utilizes a vibration mode such as an expansion mode, bending mode or contour mode and a manufacturing method thereof.

2. Description of Prior Art

FIG. 1 is a perspective view showing an example of a conventional piezoelectric vibrator being the background of the present invention. A piezoelectric vibrator 10 includes a substrate 12 made of Elinvar, for instance, and the substrate 12 includes a tetragonal frame and an island-like vibrating element 14 surrounded thereby. The island-like vibrating element 14 is connected and supported with two opposite sides of the frame by connecting portions 16, 16. On the top surface of the vibrating element 14 there is formed a piezoelectric film 18 made of, for instance, zinc oxide (ZnO) by e.g. sputtering. The piezoelectric film 18 is deposited to extend to a portion of the frame of the substrate 12 through the connecting portion 16. On the surface of the piezoelectric film 18 formed on the vibrating element 14 there is formed an electrode 20 made of aluminum or the like. The electrode 20 is extended to a lead electrode 22 through the connecting portion 16. External terminals are connected to the lead electrode 22. The vibrating element 14 on which the piezoelectric film 18 is deposited undergoes vibration in e.g. expansion mode when an electric field is applied between a proper position of the frame of the substrate 12 and the lead electrode 22.

If the vibration mode is expansion mode, the resonant frequency of the piezoelectric vibrator shown in FIG. 1 is determined by the formula $f = K(1/L)$, wherein K is a constant, and L is the length of the vibrating element 14 in the section taken along the line II—II in FIG. 1. Thus, the length L is one of the important factors determining the vibrating or resonant frequency of a given piezoelectric vibrator.

On the other hand, the method of wet etching has hitherto been used for forming such piezoelectric vibrators. Since etching proceeds in the longitudinal direction (along the surface) in the same speed as it progresses in the direction of thickness, consequently the dimensional precision of the work depends on the thickness T (FIG. 2). That is, when etching is used, the end portion of the vibrating element is eliminated in the longitudinal direction to the same extent as thickness T, this aggravating the dimensional stability. Hitherto, to improve the dimensional precision attempt has been made to do etching from both sides, but even this method is seen causing projection about the center of the thickness T as shown in FIG. 2, this interfering with sufficient dimensional precision. More specifically, even in the conventional both-side etching, dimensional scattering of some 1/10 of the thickness T has been inevitable, this being reflected in scattering of resonant frequency of the piezoelectric vibrator. In order to suppress the scattering of resonant frequency it is necessary to improve the dimensional precision and in order to improve the dimensional precision it is necessary to reduce the thickness T. However, the thickness cannot be reduced drastically considering its influence on the plate's mechanical strength, change of temperature property caused by altered structural ratio with respect to the piezoelectric layer, and the warping stress being subjected to during sputtering of the piezoelectric film. Thus, the limit of dimensional precision caused by thickness of the substrate or vibrating element presents a great obstacle for further miniaturization of piezoelectric vibrator.

SUMMARY OF THE INVENTION

It is, therefore, a principal object of the present invention to provide a piezoelectric vibrator with less scattering of resonant frequency.

Another object of the present invention is to provide the method of manufacturing piezoelectric vibrator through improvement of the dimensional precision without sacrificing the mechanical strength etc. so as to restrain scattering of the resonant frequency.

Simply speaking, the present invention is a piezoelectric vibrator, in which the thickness is reduced on one main surface side of an end portion of the vibrating element in the direction of the longitudinal length on which the resonant frequency of the mechanical vibration depends. Such piezoelectric vibrator is manufactured by etching from the other main surface side simultaneously with or after forming a thin-plate portion at the end portion of the vibrating element.

According to the present invention, the longitudinal dimensional precision on which the resonant frequency of the piezoelectric vibrator depends can be largely improved even when etching technique is used by reducing the thickness at logitudinal end portion. Hence, a piezoelectric vibrator of less frequency scattering can be obtained.

In a preferred embodiment of the present invention, the vibrating element comprises an alloy of constant modulus and a piezoelectric film deposited thereon. The use of a constant modulus alloy enables the use of various processes such as etching, cutting or pressing in forming the thin-plate portion.

These and other objects, features, aspects and advantages of the present invention will become more apparent from the following detailed description of the preferred embodiments when taken in conjunction with the accompanying drawings.

DESCRIPTION OF THE PREFERRED EMBODIMENTS

Figure 1:
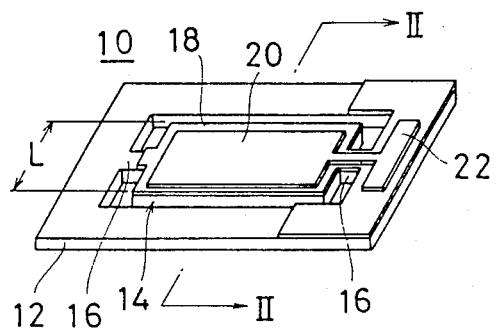
FIG. 1 is a perspective view of an example of the conventional piezoelectric vibrator constituting the background of the present invention and to which the present invention can be applied.
Figure 2:
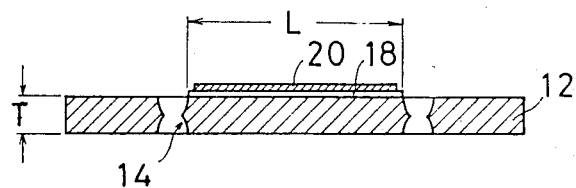
FIG. 2 is a sectional view taken along the line II—II of FIG. 1.
Figure 3:
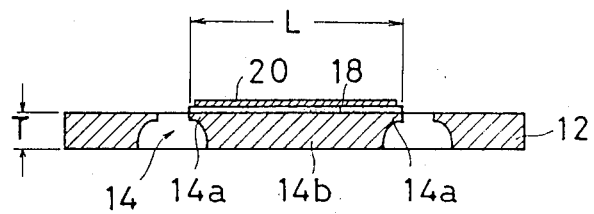
FIG. 3 is a sectional view showing an embodiment of the present invention.

FIG. 3 is a sectional view showing an embodiment of the present invention, drawn as corresponding to FIG. 2. A piezoelectric vibrator 10 is, for example, the one shown in FIG. 1 utilizing vibration in expansion mode. A substrate 12 is made of a metal material of constant modulus e.g. Elinvar. As such material ferro-nickel alloy such as 42 alloy, 36 alloy (Invar), Anvar and Co-elinvar can also be used. On the surface of a vibrating element 14 of the substrate 12 a piezoelectric film 18 is formed by, for example, sputtering. As material of piezoelectric film 18 aluminum nitride (AlN) and the like can be used besides zinc oxide. As material of electrode 20 aluminum, nickel, silver and gold etc. are applicable.

In this embodiment at the longitudinal end portion of the vibrating element 14 is formed thin-plate portion 14a by means of, for example, etching from one main surface side. The rest 14b of the vibrating element 14 has the same thickness T, hence the mechanical strength, temperature property and warping stress etc. can be made as approximately the same as with the conventional one. Meanwhile, the thickness of the end portion, i.e. thin-plate portion 14a can be made T/5 to T/6, and when such thin-plate portion 14a is etched, its edge assumes the shape as shown in FIG. 4.

Figure 4:
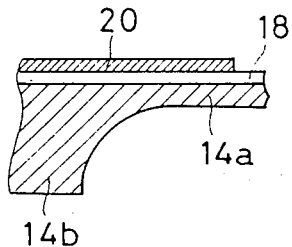
FIG. 4 is an enlarged illustrative view of the vibrating element of the embodiment shown in FIG. 3.
Figure 5A:
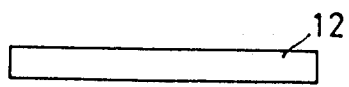
FIG. 5 is a series of illustrative views of an embodiment of a method of manufacturing a piezoelectric vibrator.
Figure 5B:
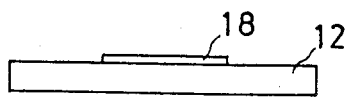
Figure 5C:
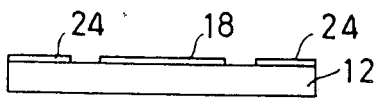
Figure 5D:
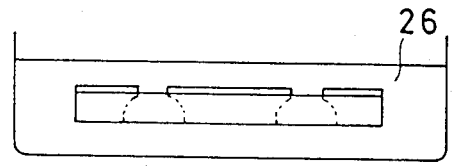
Figure 5E:
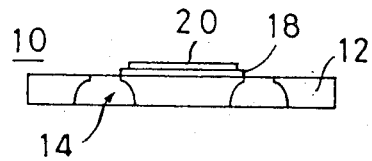

As seen from FIG. 4, the projection formed by etching in the thin-plate portion 14a is extremely small compared with the conventional counterpart (FIG. 2), hence the dimensional precision is that much higher. According to the result of the experiment made by the inventor et al., the scattering of the length L was not much more than 2 μm at one end when the thickness T is 100 μm and the thickness of the thin-plate portion is 20 μm, hence the piezoelectric vibrator obtained was extremely small compared with its conventional counterpart with regard to scattering of resonant frequency. Therefore, the manufacturing process can be simplified due to possible elimination of frequency trimming etc. Even when frequency trimming is needed, because an end portion of the vibrating element is formed as a thin-plate portion and a part of the thin-plate portion can be perfectly eliminated by the use of, for example, laser beam, therefore trimming can be performed with an increased ease.

FIG. 5 is a series of sectional views showing the order of manufacturing steps for the embodiment shown in FIG. 3. First as shown in FIG. 5 (A), the substrate 12 made of constant modulus alloy is prepared. On the surface of the substrate 12 a piezoelectric film 18 is deposited by sputtering as shown in FIG. 5 (B). Then, as shown in FIG. 5 (C), a mask 24 for defining the frame is formed by photo resist on the same main surface on which the piezoelectric film 18 is deposited. As shown in FIG. 5 (D), the monoblock unit shown in FIG. 5 (C) is then dipped in an etching soluton 26 such as solution of ferric chloride and subjected to etching. In this, case, although the etching proceeds from both main surfaces of the substrate 12, by controlling an etching time and an etching rate, it is possible to etch one main surface side faster than the other main surface side on which piezoelectric film 18 is deposited. Hence, a piezoelectric vibrator 10 with formation of thin-plate portion at the ends thereof as shown in FIG. 5 (E) can be obtained. Meanwhile, etching may as well be carried out by spraying the etching solution besides the above-mentioned dipping in the example shown in FIG. 5 (D).

Since etching allows simultaneous performance of forming the thin-plate portion 14a and the work to form or define the edge portion, even a piezoelectric vibrator having the thin-plate portion 14a can be made within approximately same working time as compared with the conventional counterpart.

Meanwhile, since in the example shown in FIG. 5 etching is carried out after depositing the piezoelectric film 18, it is also possible to use the piezoelectric film 18 as a mask for etching, this being another advantage of the preferred embodiment.

Figure 6:
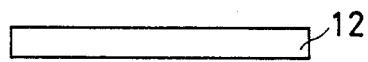
FIG. 6 is another series of illustrative views of another embodiment of a method of manufacturing the piezoelectric vibrator.
Figure 6:
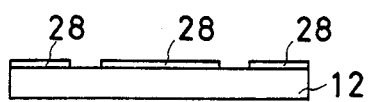
Figure 6:
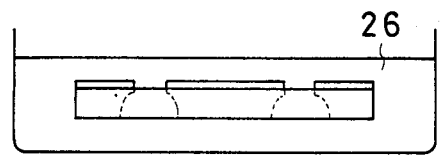
Figure 6:
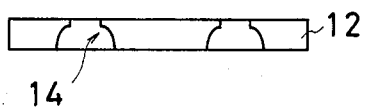
Figure 6:
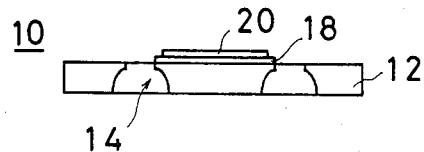

FIG. 6 is another series of sectional views showing the order of manufacturing steps for another embodiment of the present invention. On the surface of the substrate 12 prepared as illustrated in FIG. 6 (A) etching masks 24 and 28 are formed as illustrated in FIG. 6 (B). The mask 24 is for defining the frames of the substrate, while the mask 28 is for defining the vibrating element 14 (FIG. 1). Thereafter, as shown in FIG. 6 (C), the substrate 12 is dipped in an etching solution 26 for etching. After etching, the etching mask is removed as shown in FIG. 6 (D). Then, the piezoelectric film 18 and the electrode 20 are formed in succession as shown in FIG. 6 (E), i.e. FIG. 3 (E), thereby the piezoelectric vibrator 10 with thin-plate portion 14a can be obtained.

Figure 7:
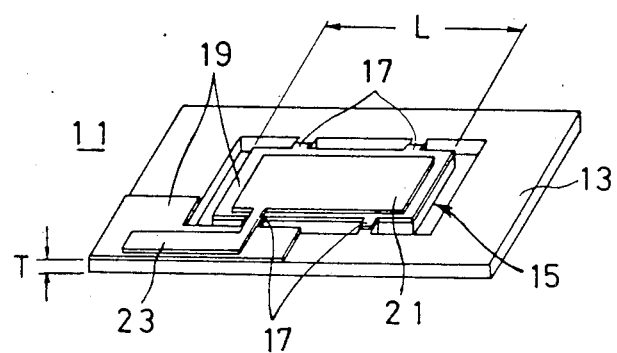
FIG. 7 is a perspective view showing another example of a piezoelectric vibrator to which the present invention is applicable.

FIG. 7 is a perspective view of another example of piezoelectric vibrator. This piezoelectric vibrator 11 shown in FIG. 7 comprises a substrate 13 made of a constant modulus alloy, and this substrate 13 includes a frame and island-like vibrating element 15 connected by connecting portion 17 to the frame. On the vibrating element 15 a piezoelectric film 19 is formed almost all over. The piezoelectric film 19 is deposited to extend to a part of the frame, and on the piezoelectric film 19 there are formed an electrode 21 and a lead electrode 23.

This piezoelectric vibrator 11, unlike the piezoelectric vibrator 10 shown in FIG. 1, is made to utilize vibration in bending mode. Connecting portions 17, 17 are formed at nodes of the bending vibration. Its resonant frequency can be given by the formula $f = K(T/L^2)$, wherein T indicates the thickness of substrate, K a constant and L length. In this embodiment the vibrator 11 is formed such that the end portion of vibrating element 15 in the direction of the length L which is concerned with a resonant frequency is thinly formed as shown in FIG. 3 or FIG. 4. Thus, the present invention is also applicable equally effective to piezoelectric vibrators utilizing vibration in bending mode.

In the embodiment shown in FIG. 3 and FIG. 7 piezoelectric vibrators were described invariably as the vibrating elements 14 or 15 are connected with the frame of the substrate 12 or 13 via connecting portions 16 or 17. Needless to say, however, it is true that if it is supported by some other structure, the vibrating element may as well be a single independent unit. Its shape, too, need not be rectangular as shown in the embodiment but it may as well be a round or square one.

Further, in the above the piezoelectric vibrator 10 or 11 of expansion or bending mode was described. The present invention is equally applicable to all piezoelectric vibrators in which resonant frequency is influenced by the length along the main surface such as the length of one side, lengths of two sides or lengths of diagonals or diameter.

In the above embodiment explanation was also made about a piezoelectric vibrator in which the piezoelectric film is deposited or formed on the substrate made of constant modulus alloy. It is, however, needless to say that the present invention is applicable also to such piezoelectric vibrators as manufactured by forming the electrode on a substrate of crystal, $LiNb_2O_3$ or $LiTa_3O_4$. When the substrate used is made of constant modulus alloy, it is also possible to have one main surface side thereof thinned by pressing or cutting, and do etching from the other main surface side.

Although embodiments of the present invention have been described and illustrated in detail, it is clearly understood that the same is by way of illustration and example only and is not to be taken by way of limitation, the spirit and scope of the present invention being limited only by the terms of the appended claims.

What is claimed is:

1. A piezoelectric vibrator comprising:
a frame; and
a vibrating element connected to the frame for mechanically vibrating at a given resonant frequency with respect to the frame;
the vibrating element having a main surface which has a length on which said resonant frequency depends; and
the vibrating element having a relatively thin portion formed as an extension of said main surface at an end thereof in the direction of the length on which said resonant frequency depends.

2. A piezoelectric vibrator in accordance with claim 1, wherein said vibrating element includes a piezoelectric element and said relatively thin portion is substantially coextensive at said end of said main surface with a corresponding end of said piezoelectric element.

3. A piezoelectric vibrator in accordance with claim 1, wherein said vibrating element includes a metallic plate made of a constant modulus alloy and a piezoelectric film formed thereon, and said relatively thin portion is formed on one main surface of an end of said metallic plate.

4. A piezoelectric vibrator in accordance with claim 1, wherein said vibrating element includes one which vibrates in vibration mode in which the resonant frequency is determined by said length along said main surface thereof.

5. A piezoelectric vibrator in accordance with claim 4, wherein said vibration mode includes an expansion mode.

6. A piezoelectric vibrator in accordance with claim 4, wherein said vibration mode includes a bending mode.

7. A piezoelectric vibrator in accordance with claim 4, wherein said vibration mode includes a contour mode.

8. A piezoelectric vibrator, comprising:
(a) an integral structure formed from a single metallic plate which comprises a constant modulus alloy, said structure comprising
  (1) a frame for defining a space,
  (2) an island-like vibrating portion located within said space, and
  (3) a connecting portion for connecting said vibrating portion to said frame;
(b) said vibrating portion having a main surface with a piezoelectric film formed thereon, a vibrating electrode being formed on a surface of said piezoelectric film;
(c) said vibrating portion having a resonant frequency, and said main surface having a length upon which said resonant frequency depends; and
(d) said vibrating portion having a relatively thin portion formed as an extension of said main surface, at an end thereof in the direction of said length upon which said resonant frequency depends.

* * * * *